(12) United States Patent
Lin et al.

(10) Patent No.: US 8,255,449 B2
(45) Date of Patent: Aug. 28, 2012

(54) HIGH-SPEED CONTINUOUS-TIME FIR FILTER

(75) Inventors: Chia-Liang Lin, Fremont, CA (US); Hsin-Che Chiang, San Jose, CA (US)

(73) Assignee: Realtek Semiconductor Corp., Science Park, HsinChu (TW)

( * ) Notice: Subject to any disclaimer, the term of this patent is extended or adjusted under 35 U.S.C. 154(b) by 810 days.

(21) Appl. No.: 12/421,647

(22) Filed: Apr. 10, 2009

(65) Prior Publication Data

US 2010/0262640 A1    Oct. 14, 2010

(51) Int. Cl.
*G06G 7/02* (2006.01)
(52) U.S. Cl. .......................................... 708/819
(58) Field of Classification Search .................... 708/819
See application file for complete search history.

(56) References Cited

U.S. PATENT DOCUMENTS 6,308,106 B1 *  10/2001  Ameri et al. .................... 700/45

* cited by examiner

*Primary Examiner* — Tan Mai
(74) *Attorney, Agent, or Firm* — Winston Hsu; Scott Margo

(57) ABSTRACT

A high-speed continuous-time FIR (finite impulse response) filter comprises a plurality of processing cells configured in a cascade topology. Each processing cell receives a first signal and a second signal from a preceding circuit and a succeeding circuit, respectively, and outputs a third signal and a fourth signal to the succeeding circuit and the preceding circuit, respectively. Each processing cell further comprises a delay cell and a summing cell. Each of the delay cell and the summing cell performs a high speed signal processing using a combination of a feedback loop and a feedforward path.

17 Claims, 4 Drawing Sheets

HIGH-SPEED CONTINUOUS-TIME FIR FILTER

FIELD OF TECHNOLOGY

This disclosure relates generally to methods and apparatus that include a continuous-time FIR (finite impulse response) filter suitable for high-speed communication.

BACKGROUND

A communication system comprises a transmitter, a receiver, and a communication channel. The transmitter launches a first signal unto the communication channel. After propagating through the communication channel, the first signal evolves into a second signal. The receiver receives the second signal and seeks to process the second signal so as to retrieve the information embedded in the first signal. If the communication channel is free of dispersion, the second signal will be substantially similar to the first signal. In this case, the difference between the first signal and the second signal is only a delay and a scaling factor, both of which can be easily handled by the receiver using various techniques of timing synchronization and automatic gain control that are well known in prior art. In reality, however, the communication channel is usually dispersive, and consequently the second signal is a distorted version of the first signal (aside from a possible delay and a possible scaling factor). A feedforward equalizer embodied by a FIR (finite impulse response) filter is an apparatus for equalizing the distortion introduced to the second signal due to channel dispersion. Most feedforward equalizers are discrete-time circuits, where a sampling device to convert the received signal into a discrete-time signal. For a high-speed communication system, however, discrete-time feedforward equalizers are very difficult to realize due to the difficulty in implementing a high-speed sampling device. In these applications, continuous-time feedforward equalizers are a good alternative. To date, high-speed continuous-time feedforward equalizers rely on LC circuits. For reference, please refer to the article "An 80 mW 40 Gb/s 7-Tap T/2-Spaced FFE in 65 nm CMOS," in 2009 *IEEE International Solid-State Circuits Conference Digest of Technical Papers*, Volume 52, pages 364-365, written by Momtaz and Green, and the references cited therein. While offering good performance, however, LC circuits are expensive. What is needed is a low-cost high-speed continuous-time feedforward equalizer.

DETAILED DESCRIPTION

The following detailed description refers to the accompanying drawings which show, by way of illustration, various embodiments in which the invention may be practiced. These embodiments are described in sufficient detail to enable those skilled in the art to practice these and other embodiments. The various embodiments are not necessarily mutually exclusive, as some embodiments can be combined with one or more other embodiments to form new embodiments. The following detailed description is, therefore, not to be taken in a limiting sense.

In an embodiment, an apparatus is disclosed for providing a high-speed continuous-time signal processing. The apparatus comprises: a first sub-cell and a second sub-cell, wherein: the first sub-cell receives a first analog signal from a preceding circuit; the second sub-cell receives a second analog signal from a succeeding circuit; the first sub-cell outputs a third analog signal to the succeeding circuit by delaying the first analog signal using a combination for a feedback loop and a feedforward path; and the second sub-cell outputs a fourth analog signal to the preceding circuit by performing a weighted sum on the first analog signal and the second analog signal in accordance with a weighting factor using a combination of a feedback loop and a feedforward path.

In an embodiment, an apparatus is disclosed for providing high-speed continuous-time equalization. The apparatus comprises a plurality of processing cells configured in a cascade topology, each of said processing cells comprising a first sub-cell and a second sub-cell, receiving a first analog signal and a second analog signal from a preceding circuit and a succeeding circuit, respectively, and outputting a third analog signal and a fourth analog signal to the succeeding circuit and the preceding circuit, respectively, in accordance with a weighting factor, wherein: each of the first sub-cell and the second sub-cell includes a feedback loop and a feedforward path.

In an embodiment a method is disclosed for providing high-speed continuous-time equalization. The method comprises: receiving a first analog signal from a preceding circuit; receiving a second analog signal from a succeeding circuit; delaying the first analog circuit to generate a third analog signal using a combination of a feedback loop and a feedforward path; transmitting the third analog signal to the succeeding circuit; performing a weighted sum on the first analog signal and the second analog signal in accordance with a weighting factor to generate a fourth analog signal using a combination of a feedback loop and a feedforward path; and transmitting the fourth analog signal to the preceding circuit.

Figure 1:
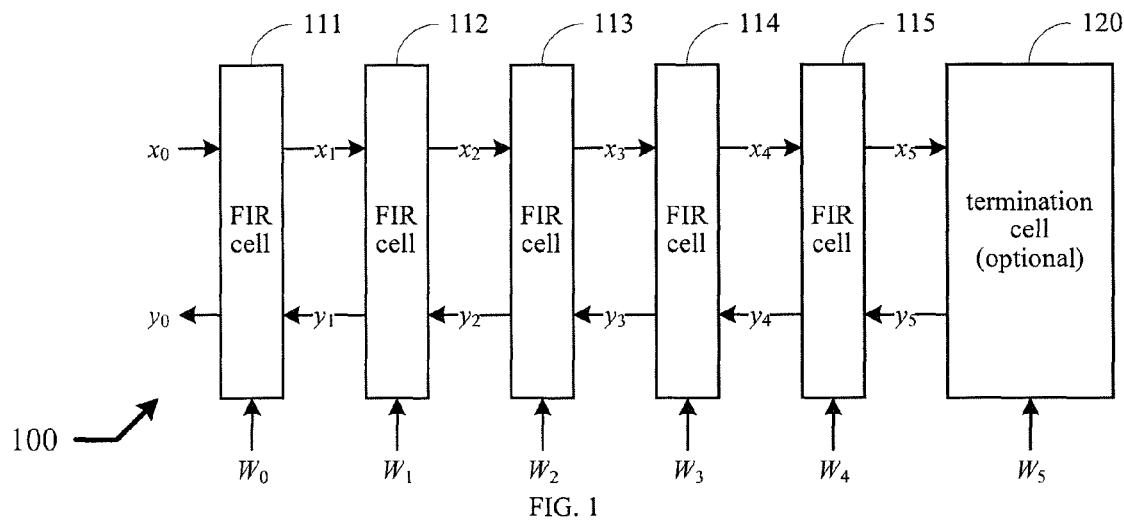
FIG. 1 shows a functional block diagram of a continuous-time FIR filter comprising a plurality of FIR cells in accordance with the present invention.

FIG. 1 shows a functional block diagram of a continuous-time FIR (finite impulse response) filter 100 in accordance with the present invention. The filter 100 comprises: a plurality of FIR cells 111-115 configured in a cascade topology, and an optional termination cell 120. Each FIR cell receives a respective first analog signal and a respective second analog signal from a respective preceding circuit and a respective succeeding circuit, respectively, and outputs a respective third analog signal and a respective fourth analog signal to the respective succeeding circuit and the respective preceding circuit, respectively. For instance, FIR cell 112 receives $x_1$ (the first analog signal) from FIR cell 111 (the preceding circuit), receives signal $y_2$ (the second analog signal) from FIR cell 113 (the succeeding circuit), outputs $x_2$ (the third analog signal) to FIR cell 113 (the succeeding circuit), and outputs $y_1$ (the fourth analog signal) to FIR cell 111 (the preceding circuit). Furthermore, each FIR cell operates in accordance with a respective weighting factor in generating the respective fourth analog signal. For instance, FIR cell 112 operates in accordance with the respective weighting factor $W_1$. When the optional termination cell 120 is used, the optional termination cell 120 receives an analog input signal ($x_5$) from its preceding circuit (FIR cell 115) and outputs an analog output signal ($y_5$) to its preceding circuit (FIR cell 115) in accordance with a weighting factor ($W_5$). When the optional terminal cell 120 is not used, the analog signal ($x_5$) is either floating or terminated with a dummy load, and the analog signal ($y_5$) is null (i.e. zero). In a preferred embodiment that is highly desirable but not absolutely necessary for the present invention, all FIR cells 111-115 are substantially identical circuits.

Figure 2:
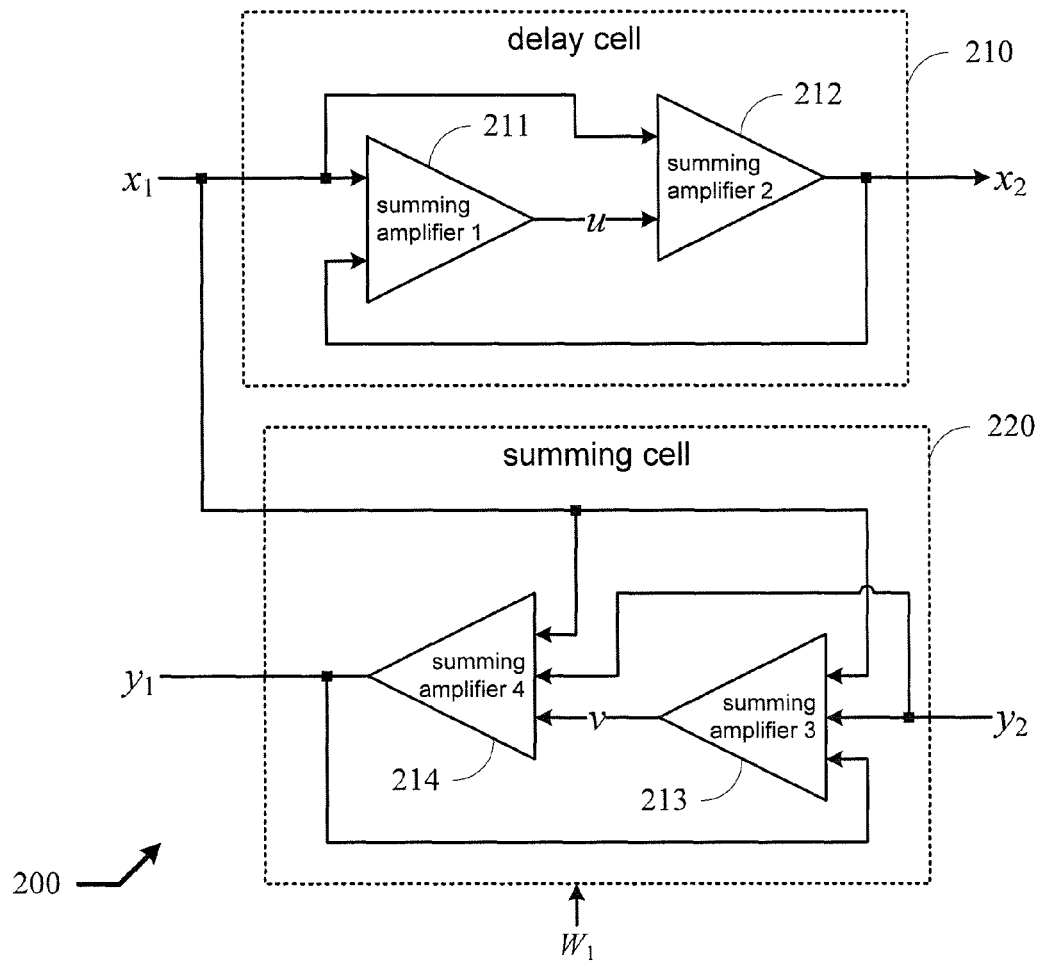
FIG. 2 shows a functional block diagram of a FIR cell in accordance with the present invention.

A functional block diagram of a FIR cell 200 suitable for embodying FIR cell 112 of FIG. 1 is depicted in FIG. 2. Note that FIR cell 200 of FIG. 2 is equally suitable for embodying the rest of the FIR cells (111, 113-115) in FIG. 1, only that the respective input and output signals are different. FIR cell 200 receives $x_1$ (a first analog signal) from its preceding circuit, receives $y_2$ (a second analog signal) from its succeeding circuit, outputs $x_2$ (a third analog signal) to the succeeding circuit, and outputs $y_1$ to the preceding circuit. FIR cell 200 comprises a delay cell 210 and a summing cell 220. Delay cell 210 receives the first analog signal $x_1$ and outputs the third analog signal $x_2$ using a combination of a first summing amplifier 211 and a second summing amplifier 212 configured in a topology that involves a first feedback loop and a first feedforward path. The first summing amplifier 211 performs a first weighted sum on the first analog signal $x_1$ and the third analog signal $x_2$, resulting in a first intermediate signal u. The second summing amplifier 212 performs a second weighted sum on the first analog signal $x_1$ and the first intermediate signal u, resulting in the third analog signal $x_2$. A first feedback loop is formed because an output (u) from the first summing amplifier 211 is provided as an input to the second summing amplifier 212, while an output ($x_2$) from the second summing amplifier 212 is fed back and provided as an input to the first summing amplifier 211. A first feedforward path is formed because the first analog signal $x_1$ is directly provided as an input to the second summing amplifier 212, thus effectively introducing a fast path that bypasses the first summing amplifier 211. Summing cell 220 receives the first analog signal $x_1$ and the second analog signal $y_2$ and outputs the fourth analog signal $y_1$ using a combination of a third summing amplifier 213 and a fourth summing amplifier 214 configured in a topology that involves a second feedback loop, a second feedforward path, and a third feedforward path. The third summing amplifier 213 performs a third weighted sum on the first analog signal $x_1$, the second analog signal $y_2$, and the fourth analog signal $y_1$, resulting in a second intermediate signal v. The fourth summing amplifier 214 performs a fourth weighted sum on the first analog signal $x_1$, the second analog signal $y_2$, and the second intermediate signal v, resulting in the fourth analog signal $y_1$. A second feedback loop is formed because an output (v) from the third summing amplifier 213 is provided as an input to the fourth summing amplifier 214, while an output ($y_1$) from the fourth summing amplifier 214 is fed back and provided as an input to the third summing amplifier 213. A second feedforward path is formed because the first analog signal $x_1$ is directly provided as an input to the fourth summing amplifier 214, thus effectively introducing a fast path that bypasses the third summing amplifier 213. A third feedforward path is formed because the second analog signal $y_2$ is directly provided as an input to the fourth summing amplifier 214, thus effectively introducing a fast path that bypasses the third summing amplifier 213.

The first summing amplifier 211 performs a weighted-sum function that can be mathematically modeled as:

$$U(s)=(a_1 \cdot X_1(s)+a_2 \cdot X_2(s)) \cdot G_1(s) \qquad (1)$$

where $X_1(s)$, $X_2(s)$, and $U(s)$ denote the Laplace transforms of $x_1$, $x_2$, and u, respectively, $a_1$ and $a_2$ are weights for the two summing inputs $x_1$ and $x_2$, respectively, and $G_1(s)$ is a frequency response of the first summing amplifier 211. The second summing amplifier 212 performs a weighted-sum function that can be mathematically modeled as:

$$X_2(s)=(a_3 \cdot X_1(s)+a_4 \cdot U(s)) \cdot G_2(s) \qquad (2)$$

where $a_3$ and $a_4$ are weights for the two summing inputs $x_1$ and u, respectively, and $G_2(s)$ is a frequency response of the second summing amplifier 212. Combining Equations (1) and (2), one obtains:

$$X_2(s)=X_1(s) \cdot [a_3 \cdot G_2(s)+a_1 \cdot a_4 \cdot G_1(s) \cdot G_2(s)]/[1-a_2 \cdot a_4 \cdot G_1(s) \cdot G_2(s)] \qquad (3)$$

The third summing amplifier 213 performs a weighted-sum function that can be mathematically modeled as:

$$V(s)=(a_5 \cdot X_1(s)+a_6 \cdot Y_2(s)+a_7 \cdot Y_1(s)) \cdot G_3(s) \qquad (4)$$

where $Y_1(s)$, $Y_2(s)$, and $V(s)$ denote the Laplace transforms of $y_1$, $y_2$, and v, respectively, $a_5$, $a_6$, and $a_7$ are weights for the three summing inputs $x_1$, $y_2$, and $y_1$, respectively, and $G_3(s)$ is a frequency response of the third summing amplifier 213. The fourth summing amplifier 214 performs a weighted-sum function that can be mathematically modeled as:

$$Y_1(s)=(a_8 \cdot X_1(s)+a_9 \cdot Y_2(s)+a_{10} \cdot V(s)) \cdot G_4(s) \qquad (5)$$

where $a_8$, $a_9$, and $a_{10}$ are weights for the three summing inputs $x_1$, $y_2$, and v, respectively, and $G_4(s)$ is a frequency response of the fourth summing amplifier 214. Combining Equations (4) and (5), one obtains:

$$Y_1(s) = X_1(s)\frac{\left[\begin{array}{c}a_8 \cdot G_4(s)+a_5 \cdot \\ a_{10} \cdot G_3(s) \cdot G_4(s)\end{array}\right]}{\left[\begin{array}{c}1-a_7 \cdot a_{10} \cdot \\ G_3(s) \cdot G_4(s)\end{array}\right]} + Y_2(s)\frac{\left[\begin{array}{c}a_9 \cdot G_4(s)+a_6 \cdot \\ a_{10} \cdot G_3(s) \cdot G_4(s)\end{array}\right]}{\left[\begin{array}{c}1-a_7 \cdot a_{10} \cdot \\ G_3(s) \cdot G_4(s)\end{array}\right]} \qquad (6)$$

As mentioned above, delay cell 210 and summing cell 220 both utilizes a combination of a feedback loop and a feedforward path. A feedback loop results in a denominator term of a transfer function (i.e. the $[1-a_2 \cdot a_4 \cdot G_1(s) \cdot G_2(s)]$ term in Equation (3), and the $[1-a_7 \cdot a_{10} \cdot G_3(s) \cdot G_4(s)]$ term in Equation (6)). A feedforward path results in an additional term in a numerator of the transfer function (i.e. the $a_3 \cdot G_2(s)$ term in Equation (3), and the $a_8 \cdot G_4(s)$ term and the $a_9 \cdot G_4(s)$ in Equation (6)). As well known in classical control theory, feedback is an effective method for extending an operational bandwidth of a system. A feedforward path also helps in improving a system speed by reducing a response time due to bypassing a functional block. As a result, delay cell 210 and summing cell 220 can both be very fast, thus enabling high-speed operation for the FIR cell 200.

Figure 3:
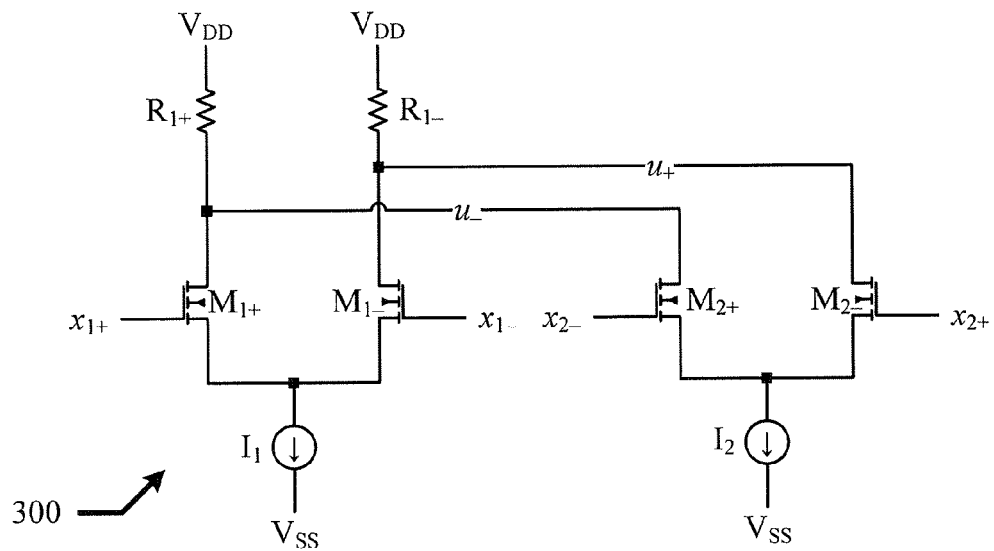
FIG. 3 shows a schematic diagram of a first summing amplifier for the FIR cell of FIG. 2.

An exemplary circuit 300 depicted in FIG. 3 is suitable for embodying the first summing amplifier 211 for the delay cell 210 of FIG. 2. In this embodiment, a differential circuit topology is used, wherein a signal is embodied by a positive-end signal (annotated by the subscript "+") and a negative-end signal end (annotated by the subscript "−"). For instance, the signal $x_1$ is represented by the positive-end signal $x_{1+}$ and the negative-end signal $x_{1-}$ and the signal $x_1$ is equal to a difference between the positive-end signal $x_{1+}$ and the negative-end signal $x_{1-}$. Circuit 300 comprises: a first differential pair comprised of two NMOS (n-channel metal-oxide semiconductor) transistors $M_{1+}$ and $M_{1-}$, a second differential pair comprised of two NMOS transistors $M_{2+}$ and $M_{2-}$, a first current source $I_1$, a second current source $I_2$, and a pair of resistors $R_{1+}$ and $R_{1-}$. Throughout this disclosure, $V_{SS}$ denotes a first virtually fixed-potential circuit node that is usually referred to as "ground," and $V_{DD}$ denotes a second virtually fixed-potential circuit node that is usually referred to as "supply." The first differential pair $M_{1+}$-$M_{1-}$ is biased by the first current source $I_1$, receives and provides amplification for the input signal $x_1$, and delivers an amplification output to the resistor pair $R_{1+}$-$R_{1-}$, which serves as a load. The second differential pair $M_{2+}$-$M_{2-}$ is biased by the second current source $I_2$, receives and provides amplification for the output signal $x_2$, and also delivers an amplification output to the resistor pair $R_{1+}$-$R_{1-}$. Since the resistor pair $R_{1+}$-$R_{1-}$ is a shared load for the first differential pair $M_{1+}$-$M_{1-}$ and the second differential pair $M_{2+}$-$M_{2-}$, the two amplification outputs are effectively summed, resulting in the intermediate signal u. In this embodiment, with reference to Equation (1), the coefficient $a_1$ is a positive number determined by the size of the first differential pair $M_{1+}$-$M_{1-}$ and the magnitude of the first current source $I_1$, while the coefficient $a_2$ is a negative number determined by the size of the second differential pair $M_{2+}$-$M_{2-}$ and the magnitude of the second current source $I_2$.

Figure 4:
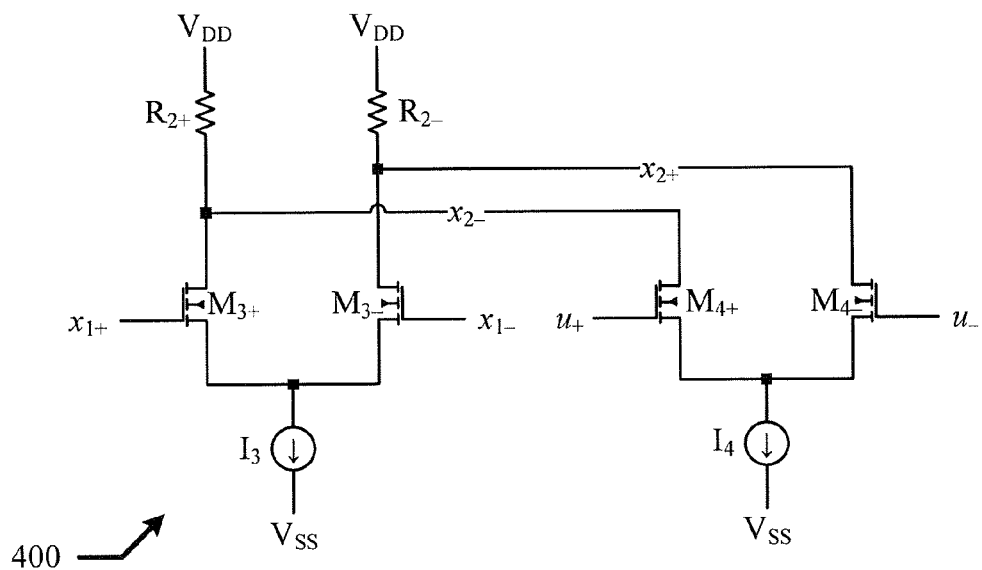
FIG. 4 shows a schematic diagram of a second summing amplifier for the FIR cell of FIG. 2.

An exemplary circuit 400 depicted in FIG. 4 is suitable for embodying the second summing amplifier 212 for the delay cell 210 of FIG. 2. In this embodiment, a differential circuit topology is also used. Circuit 400 comprises: a first differential pair comprised of two NMOS transistors $M_{3+}$ and $M_{3-}$, a second differential pair comprised of two NMOS transistors $M_{4+}$ and $M_{4-}$, a first current source $I_3$, a second current source $I_4$, and a pair of resistors $R_{2+}$ and $R_{2-}$. The first differential pair $M_{3+}$-$M_{3-}$ is biased by the first current source $I_3$, receives and provides amplification for the input signal $x_1$, and delivers an amplification output to the resistor pair $R_{2+}$-$R_{2-}$, which serves as a load. The second differential pair $M_{4+}$-$M_{4-}$ is biased by the second current source $I_4$, receives and provides amplification for the intermediate signal u, and also delivers an amplification output to the resistor pair $R_{2+}$-$R_{2-}$. Since the resistor pair $R_{2+}$-$R_{2-}$ is a shared load for the first differential pair $M_{3+}$-$M_{3-}$ and the second differential pair $M_{4+}$-$M_{4-}$, the two amplification outputs are effectively summed, resulting in the output signal $x_2$. In this embodiment, with reference to Equation (2), the coefficient $a_3$ is a positive number determined by the size of the first differential pair $M_{3+}$-$M_{3-}$ and the magnitude of the first current source $I_3$, while the coefficient $a_4$ is a positive number determined by the size of the second differential pair $M_{4+}$-$M_{4-}$ and the magnitude of the second current source $I_4$.

Figure 5:
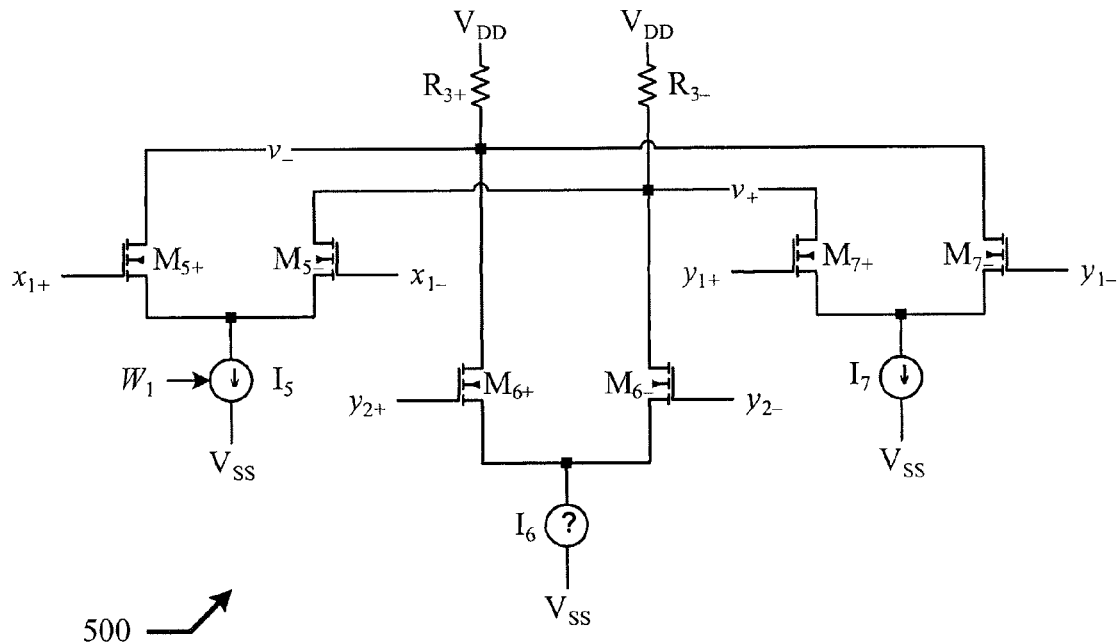
FIG. 5 shows a schematic diagram of a third summing amplifier for the FIR cell of FIG. 2.

An exemplary circuit 500 depicted in FIG. 5 is suitable for embodying the third summing amplifier 213 for the summing cell 220 of FIG. 2. In this embodiment, a differential circuit topology is used, wherein a signal is embodied by a positive-end signal (annotated by the subscript "+") and a negative-end signal end (annotated by the subscript "−"). Circuit 500 comprises: a first differential pair comprised of two NMOS (n-channel metal-oxide semiconductor) transistors $M_{5+}$ and $M_{5-}$, a second differential pair comprised of two NMOS transistors $M_{6+}$ and $M_{6-}$, a third differential pair comprised of two NMOS transistors $M_{7+}$ and $M_{7-}$, a first current source $I_5$ controlled by the weighting factor $W_1$, a second current source $I_6$, a third current source $I_7$, and a pair of resistors $R_{3+}$ and $R_{3-}$. The first differential pair $M_{5+}$-$M_{5-}$ is biased by the first current source $I_5$, receives and provides amplification for signal $x_1$, and delivers an amplification output to the resistor pair $R_{3+}$-$R_{3-}$, which serves as a load. The second differential pair $M_{6+}$-$M_{6-}$ is biased by the second current source $I_6$, receives and provides amplification for signal $y_2$, and also delivers an amplification output to the resistor pair $R_{3+}$-$R_{3-}$. The third differential pair $M_{7+}$-$M_{7-}$ is biased by the third current source $I_7$, receives and provides amplification for signal $y_1$, and also delivers an amplification output to the resistor pair $R_{3+}$-$R_{3-}$. Since the resistor pair $R_{3+}$-$R_{3-}$ is a shared load for the first differential pair $M_{5+}$-$M_{5-}$, the second differential pair $M_{6+}$-$M_{6-}$, and third differential pair $M_{7+}$-$M_{7-}$, the three amplification outputs are effectively summed, resulting in the intermediate signal v. In this embodiment, with reference to Equation (4), the coefficient $a_5$ is a positive number determined by the size of the first differential pair $M_{5+}$-$M_{5-}$ and the magnitude of the first current source $I_5$, the coefficient $a_6$ is a positive number determined by the size of the second differential pair $M_{6+}$-$M_{6-}$ and the magnitude of the second current source $I_6$, while the coefficient $a_7$ is a negative number determined by the size of the third differential pair $M_{7+}$-$M_{7-}$ and the magnitude of the third current source $I_7$. In an embodiment, all three current sources $I_5$, $I_6$, and $I_7$ are embodied by a NMOS transistor with a source terminal tied to VSS, a drain terminal tied to a respective differential pair that it is biasing, and a gate terminal tied to a respective control voltage, wherein the respective control voltages for $I_6$ and $I_7$ are fixed but the control voltage for $I_5$ is variable and controlled by the weighting factor $W_1$. If the coefficient $a_5$ needs to be negative, all one needs to do is to reverse the polarity of the output of the first differential pair $M_{5+}$-$M_{5-}$ by swapping their connection to the resistor pair $R_{3+}$-$R_{3-}$.

Figure 6:
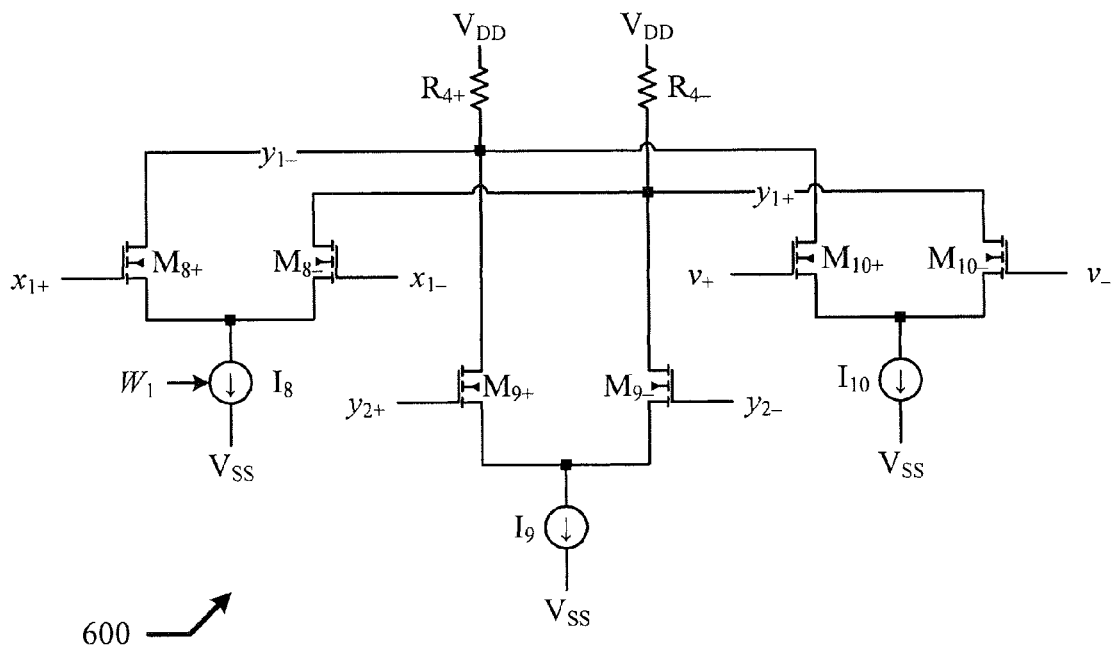
FIG. 6 shows a schematic diagram of a fourth summing amplifier for the FIR cell of FIG. 2.

An exemplary circuit 600 depicted in FIG. 6 is suitable for embodying the fourth summing amplifier 214 for the summing cell 220 of FIG. 2. In this embodiment, a differential circuit topology is used, wherein a signal is embodied by a positive-end signal (annotated by the subscript "+") and a negative-end signal end (annotated by the subscript "−"). Circuit 600 comprises: a first differential pair comprised of two NMOS (n-channel metal-oxide semiconductor) transistors $M_{8+}$ and $M_{8-}$, a second differential pair comprised of two NMOS transistors $M_{9+}$ and $M_{9-}$, a third differential pair comprised of two NMOS transistors $M_{10+}$ and $M_{10-}$, a first current source $I_8$ controlled by the weighting factor $W_1$, a second current source $I_9$, a third current source $I_{10}$, and a pair of resistors $R_{4+}$ and $R_{4-}$. The first differential pair $M_{8+}$-$M_{8-}$ is biased by the first current source $I_8$, receives and provides amplification for signal $x_1$, and delivers an amplification output to the resistor pair $R_{4+}$-$R_{4-}$, which serves as a load. The second differential pair $M_{9+}$-$M_{9-}$ is biased by the second current source $I_9$, receives and provides amplification for signal $y_2$, and also delivers an amplification output to the resistor pair $R_{4+}$-$R_{4-}$. The third differential pair $M_{10+}$-$M_{10-}$ is biased by the third current source $I_{10}$, receives and provides amplification for signal v, and also delivers an amplification output to the resistor pair $R_{4+}$-$R_{4-}$. Since the resistor pair $R_{4+}$-$R_{4-}$ is a shared load for the first differential pair $M_{8+}$-$M_{8-}$, the second differential pair $M_{9+}$-$M_{9-}$, and third differential pair $M_{10+}$-$M_{10-}$, the three amplification outputs are effectively summed, resulting in the signal $y_1$. In this embodiment, with reference to Equation (5), the coefficient $a_8$ is a positive number determined by the size of the first differential pair $M_{8+}$-$M_{8-}$ and the magnitude of the first current source $I_8$, the coefficient $a_9$ is a positive number determined by the size of the second differential pair $M_{9+}$-$M_{9-}$ and the magnitude of the second current source $I_9$, while the coefficient $a_{10}$ is a positive number determined by the size of the third differential pair $M_{10+}$-$M_{10-}$ and the magnitude of the third current source $I_{10}$. In an embodiment, all three current sources $I_8$, $I_9$, and $I_{10}$ are embodied by a NMOS transistor with a source terminal tied to $V_{SS}$, a drain terminal tied to a respective differential pair that it is providing biasing current to, and a gate terminal tied to a respective control voltage, wherein the respective control voltages for $I_9$ and $I_{10}$ are fixed but the control voltage for $I_8$ is variable and controlled by the weighting factor $W_1$. If the coefficient $a_8$ needs to be negative, all one needs to do is to reverse the polarity of the output of the first differential pair $M_{8+}$-$M_{8-}$ by swapping their connection to the resistor pair $R_{4+}$-$R_{4-}$.

Figure 7:
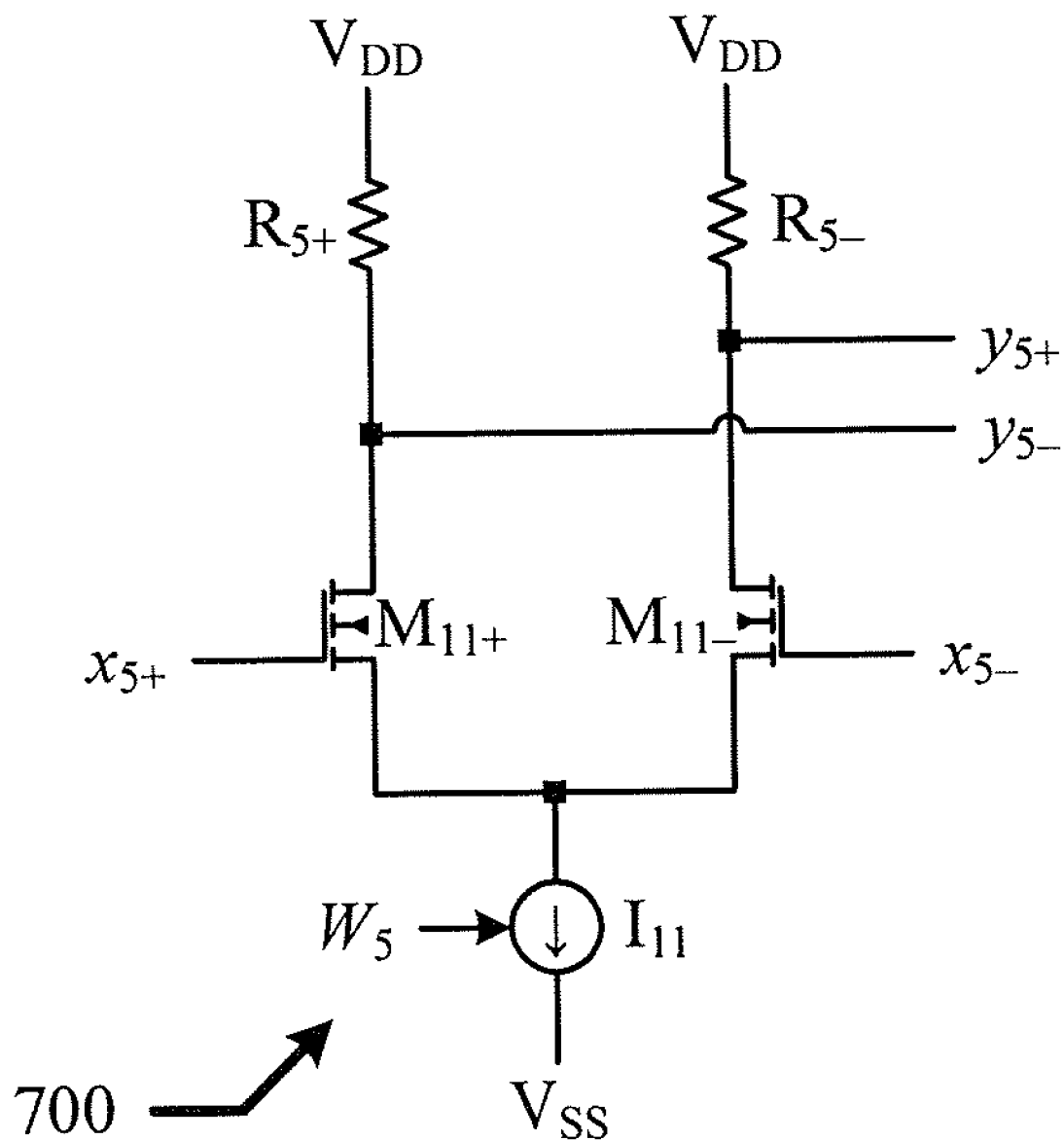
FIG. 7 shows a schematic diagram of a termination cell for the filter of FIG. 1.

An exemplary circuit 700 depicted in FIG. 7 is suitable for embodying the optional termination cell 120 of FIG. 1. Circuit 700 comprises a differential pair $M_{11+}$-$M_{11-}$, a resistor pair $R_{5+}$-$R_{5-}$, and a current source $I_{11}$ controlled by the weighting factor $W_5$. The differential pair $M_{11+}$-$M_{11-}$ is biased by the current source $I_{11}$, receives $x_5$, provides an amplification, and delivers the amplification output to the resistor pair $R_{5+}$-$R_{5-}$, resulting in $y_5$. Differential pair $M_{11+}$-$M_{11-}$ receives a bias current from the current source $I_{11}$. In an embodiment, the current source $I_{11}$ comprises a NMOS transistor, with a source terminal tied to $V_{SS}$, a gate terminal tied to a variable control voltage determined by the weighting factor $W_5$, and a drain terminal tied to the differential pair $M_{11+}$-$M_{11-}$.

Although specific embodiments have been illustrated and described herein, it will be appreciated by those of ordinary skill in the art that any arrangement that is calculated to achieve the same purpose may be substituted for the specific embodiments shown. This application is intended to cover adaptations and variations of the embodiments discussed herein. Various embodiments use permutations and/or combinations of embodiments described herein. It is to be understood that the above description is intended to be illustrative, and not restrictive, and that the phraseology or terminology employed herein is for the purpose of description.

What is claimed is:

1. An apparatus comprising a first sub-cell and a second sub-cell, wherein:
   the first sub-cell receives a first analog signal from a preceding circuit;
   the second sub-cell receives a second analog signal from a succeeding circuit;
   the first sub-cell outputs a third analog signal to the succeeding circuit by delaying the first analog signal using a combination for a feedback loop and a feedforward path; and
   the second sub-cell outputs a fourth analog signal to the preceding circuit by performing a summing on the first analog signal and the second analog signal in accordance with a weighting factor using a combination of a feedback loop and a feedforward path.

2. The apparatus of claim 1, wherein the first sub-cell further comprises:
   a first summing amplifier for performing a first weighted sum on the first analog signal and the third analog signal to generate an intermediate signal; and
   a second summing amplifier for performing a second weighted sum on the first analog signal and the intermediate signal.

3. The apparatus of claim 2, wherein the first summing amplifier comprises two differential pairs sharing a common load.

4. The apparatus of claim 2, wherein the second summing amplifier comprises two differential pairs sharing a common load.

5. The apparatus of claim 1, wherein the second sub-cell further comprises:
   a first summing amplifier for performing a first weighted sum in accordance with the weighting factor on the first analog signal, the second analog signal, and the fourth analog signal to generate an intermediate signal; and
   a second summing amplifier for performing a second weighted sum in accordance with the weighting factor on the first analog signal, the second analog signal, and the intermediate signal.

6. The apparatus of claim 5, wherein the first summing amplifier comprises three differential pairs sharing a common load.

7. The apparatus of claim 5, wherein the second summing amplifier comprises three differential pairs sharing a common load.

8. A method for providing high-speed continuous-time equalization, the method comprising the following steps:
   (a) receiving a first analog signal from a preceding circuit;
   (b) receiving a second analog signal from succeeding circuit;
   (c) delaying the first analog circuit to generate a third analog signal using a combination of a feedback loop and a feedforward path;
   (d) transmitting the third analog signal to the succeeding circuit;
   (e) performing a summing on the first analog signal and the second analog signal in accordance with a weighting factor to generate a fourth analog signal using a combination of a feedback loop and a feedforward path; and
   (f) transmitting the fourth analog signal to the preceding circuit.

9. The method of claim 8, wherein step (c) further comprises: performing a first weighted sum on the first analog signal and the third analog signal to generate an intermediate signal, and performing a second weighted sum on the first analog signal and the intermediate signal to generate the third analog signal.

10. The method of claim 8, wherein step (e) further comprises: performing a first weighted sum in accordance with the weighting factor on the first analog signal, the second analog signal, and the fourth analog signal to generate an intermediate signal, and performing a second weighted sum in accordance with the weighting factor on the first analog signal, the second analog signal, and the intermediate signal to generate the fourth analog signal.

11. An apparatus for providing high-speed continuous-time equalization, the apparatus comprising a plurality of processing cells configured in a cascade topology, each of said processing cells comprising:
    a first sub-cell and a second sub-cell, receiving a first analog signal and a second analog signal from a preceding circuit and a succeeding circuit, respectively, and outputting a third analog signal and a fourth analog signal to the succeeding circuit and the preceding circuit, respectively, in accordance with a weighting factor, wherein: each of the first sub-cell and the second sub-cell includes a feedback loop and a feedforward path.

12. The apparatus of claim 11, wherein the first sub-cell comprises a first summing amplifier for performing a first weighted sum on the first analog signal and the third analog signal to generate an intermediate signal, and a second summing amplifier for performing a second weighted sum on the first analog signal and the intermediate signal to generate the third analog signal.

13. The apparatus of claim 12, wherein the first summing amplifier comprises two differential pairs sharing a common load.

14. The apparatus of claim 12, wherein the second summing amplifier comprises two differential pairs sharing a common load.

15. The apparatus of claim 11, wherein the second sub-cell comprises a first summing amplifier for performing a first weighted sum in accordance with the weighting factor on the first analog signal, the second analog signal, and the fourth analog signal to generate an intermediate signal, and a second summing amplifier for performing a second weighted sum in accordance with the weighting factor on the first analog signal, the second analog signal, and the intermediate signal to generate the fourth analog signal.

16. The apparatus of claim 15, wherein the first summing amplifier comprises three differential pairs sharing a common load.

17. The apparatus of claim 15, wherein the second summing amplifier comprises three differential pairs sharing a common load.

* * * * *